(12) United States Patent
Kim et al.

(10) Patent No.: US 11,113,996 B2
(45) Date of Patent: Sep. 7, 2021

(54) DISPLAY INCLUDING BENDING AREA AND ELECTRONIC DEVICE COMPRISING SAME

(71) Applicant: Samsung Electronics Co., Ltd., Gyeonggi-do (KR)

(72) Inventors: Min-Uk Kim, Gyeonggi-do (KR); Hoon-Do Heo, Gyeonggi-do (KR); Seon-Haeng Lee, Gyeonggi-do (KR); Kwang-Tai Kim, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/754,911

(22) PCT Filed: Oct. 12, 2018

(86) PCT No.: PCT/KR2018/012067
§ 371 (c)(1),
(2) Date: Apr. 9, 2020

(87) PCT Pub. No.: WO2019/074332
PCT Pub. Date: Apr. 18, 2019

(65) Prior Publication Data
US 2020/0294428 A1    Sep. 17, 2020

(30) Foreign Application Priority Data

Oct. 12, 2017  (KR) .................. 10-2017-0132602

(51) Int. Cl.
*G09F 9/30* (2006.01)
*G06F 3/041* (2006.01)
*G06F 3/047* (2006.01)

(52) U.S. Cl.
CPC .............. *G09F 9/301* (2013.01); *G06F 3/047* (2013.01); *G06F 3/0412* (2013.01)

(58) Field of Classification Search
CPC ...... G06F 3/0412; G06F 3/047; G06F 1/1643; G06F 1/1637; G06F 1/16; H05K 1/189;
(Continued)

(56) References Cited

U.S. PATENT DOCUMENTS

2013/0021268 A1    1/2013  Lee et al.
2014/0126228 A1    5/2014  Lee et al.
(Continued)

FOREIGN PATENT DOCUMENTS

EP     2 945 352      11/2015
JP     2014071472      4/2014
(Continued)

OTHER PUBLICATIONS

PCT/ISA/210 Search Report dated Jan. 22, 2019 issued on PCT/KR2018/012067, pp. 5.
(Continued)

*Primary Examiner* — Muhammad N Edun
(74) *Attorney, Agent, or Firm* — The Farrell Law Firm, P.C.

(57) ABSTRACT

A display according to various embodiments of the present invention may comprise: a touchscreen panel; a display panel disposed under the touchscreen panel and including a first flexible substrate; a drive circuit for driving the touchscreen panel or the display panel; and a second flexible substrate extending outward from the touchscreen panel in a partial layer of the touchscreen panel, wherein the second flexible substrate comprises: a drive circuit area in which the drive circuit is disposed; one or more first wirings connected to the drive circuit and the touchscreen panel; and a bending area which is bent with respect to the touchscreen panel. Various other embodiments may also be possible.

15 Claims, 15 Drawing Sheets

(58) Field of Classification Search
CPC ......... H05K 1/028; H05K 2201/09263; H05K 2201/09727; H05K 2201/0979; H05K 3/361; G09F 9/30; G09F 9/301; H04M 1/0266; H04M 2250/22; H04M 1/0277
See application file for complete search history.

(56) References Cited

U.S. PATENT DOCUMENTS

| | | | |
|---|---|---|---|
| 2016/0014882 A1 | 1/2016 | Jongman et al. | |
| 2016/0054832 A1 | 2/2016 | Klm et al. | |
| 2016/0098120 A1 | 4/2016 | Miyake | |
| 2016/0118616 A1* | 4/2016 | Hiroki | H01L 51/0097 257/40 |
| 2016/0147345 A1 | 5/2016 | Lee et al. | |
| 2016/0154435 A1* | 6/2016 | Yanagisawa | H04N 13/31 348/47 |
| 2016/0268360 A1* | 9/2016 | Ikeda | H01L 27/323 |
| 2017/0031522 A1 | 2/2017 | Hong et al. | |
| 2017/0090661 A1 | 3/2017 | Kim et al. | |
| 2017/0148702 A1* | 5/2017 | Funayama | G02F 1/13452 |
| 2017/0242457 A1 | 8/2017 | Lee et al. | |
| 2017/0277313 A1 | 9/2017 | Lee et al. | |
| 2018/0307884 A1* | 10/2018 | Xu | G06F 3/041661 |

FOREIGN PATENT DOCUMENTS

| | | |
|---|---|---|
| KR | 101212172 | 12/2012 |
| KR | 1020130010637 | 1/2013 |
| KR | 1020140108827 | 9/2014 |
| KR | 1020150082032 | 7/2015 |
| KR | 1020160013445 | 2/2016 |
| KR | 1020160024425 | 3/2016 |
| KR | 1020170015673 | 2/2017 |

OTHER PUBLICATIONS

PCT/ISA/237 Written Opinion dated Jan. 22, 2019 issued on PCT/KR2018/012067, pp. 7.
European Search Report dated Sep. 28, 2020 issued in counterpart application No. 18867134.1-1216, 13 pages.

* cited by examiner

DISPLAY INCLUDING BENDING AREA AND ELECTRONIC DEVICE COMPRISING SAME

PRIORITY

This application is a National Phase Entry of International Application No. PCT/KR2018/012067, which was filed on Oct. 12, 2018, and claims priority to Korean Patent Application No. 10-2017-0132602 filed in the Korean Intellectual Property Office on Oct. 12, 2017, the content of each of which is incorporated herein by reference.

TECHNICAL FIELD

The disclosure relates to an electronic device, and more particularly, to an electronic device including a display.

BACKGROUND ART

An electronic device refers to a device that executes a specific function according to a loaded program, such as a home appliance, an electronic note, a portable multimedia player (PMP), a mobile communication terminal, a tablet personal computer (PC), a video/audio player, a desktop/laptop computer, an in-vehicle navigator, and so on. For example, electronic devices may output information stored therein as sounds or an image. As the integration degree of electronic devices has increased and ultra-high speed, large-capacity wireless communication has been widely used, a single electronic device is recently equipped with a variety of functions.

A portable electronic device includes a window. And an image displayed on a display inside the electronic device is viewed through the window from the outside. The window may include a transparent area and a bezel area surrounding the transparent area. The bezel area is formed to be opaque so as to cover wires and devices under the bezel area. The display may be configured as a touch screen having a display panel and a touch screen panel included therein.

SUMMARY

To achieve a large screen on one surface of a small sized portable electronic device, a size of the transparent area of the window may be made large, whereas a size of the bezel area of the window may be made small. The size of the bezel area should be large enough to cover wiring units formed at an edge of a display or a touch panel inside the electronic device, or flexible printed circuit boards (FPCBs) connected to the wiring units, so that the wiring units and the FPCBs may not be exposed outward. Accordingly, there is a limitation on reduction of the size of the bezel area.

The FPCBs are bendable to thereby reduce the size of the bezel area. For example, an FPCB may have one end connected to a wiring unit formed at an edge of the display, and the other end connected to a control integrated circuit (IC). If the FPCB is bended, the control IC is located under the display and thus the size of the bezel area may be reduced. During bending of the FPCB, a bended part of the FPCB may be unstable, thus resulting in poor process handling and generating a crack on a circuit wire in the bended part.

An aspect of the disclosure is to address at least the above-mentioned problems and/or disadvantages and to provide at least the advantages described below. Accordingly, an aspect of the disclosure is to provide a display and an electronic device having the same, in which the bezel area of a window can be reduced.

Another aspect of the disclosure is to provide a display and an electronic device having the same, which can improve assembly between the display panel and a touch panel.

In accordance with an aspect of the disclosure, there is provided a display. The display may include a touch screen panel, a display panel disposed under the touch screen panel, and including a first flexible substrate, a driving circuit configured to drive the touch screen panel or the display panel, and a second flexible substrate extending from a partial portion of the touch screen panel to the outside of the touch screen panel. The second flexible substrate may include a driving circuit area in which the driving circuit is disposed, at least one first wire connected to the driving circuit and the touch screen panel, and a bending area bent with respect to the touch screen panel.

In accordance with another aspect of the disclosure, there is provided an electronic device. The electronic device may include a housing including a first surface, and a second surface facing in a direction opposite to the first surface, a circuit board disposed inside the housing, and a display disposed at least partially between the first surface and the circuit board. The display may include a window, a touch screen panel disposed under the window, a display panel disposed under the touch screen panel, and including a first flexible substrate, a driving circuit configured to drive the touch screen panel or the display panel, and a second flexible substrate extending from a partial portion of the touch screen panel to the outside of the touch screen panel. The second flexible substrate may include a driving circuit area in which the driving circuit is disposed, at least one first wire connected to the driving circuit and the touch screen panel, and a bending area bent with respect to the touch screen panel.

In accordance with another aspect of the disclosure, there is provided a method for fabricating a display. The method may include preparing a window, attaching at least a part of a touch screen panel to the window, attaching at least a part of a display panel to at least a part of the touch screen panel, and bending a second flexible substrate of the touch screen panel.

In accordance with another aspect of the disclosure, there is provided a display. The display may include a window, a touch screen panel disposed under the window, a display panel disposed under the touch screen panel, and including a first flexible substrate, a driving circuit configured to drive the touch screen panel or the display panel, and a second flexible substrate extending from a partial portion of the touch screen panel to the outside of the touch screen panel, and including at least one wire connected to the driving circuit and the touch screen panel. The second flexible substrate may be bent together with the at least one first wire, thereby surrounding the first flexible substrate.

As is apparent from the foregoing description, in a display and an electronic device including the same, according to various embodiments of the disclosure, that since a second flexible substrate is bent, the size of a bezel area of the electronic device, which covers at least one wire disposed on the second flexible substrate, can be reduced.

DETAILED DESCRIPTION

Figure 1:
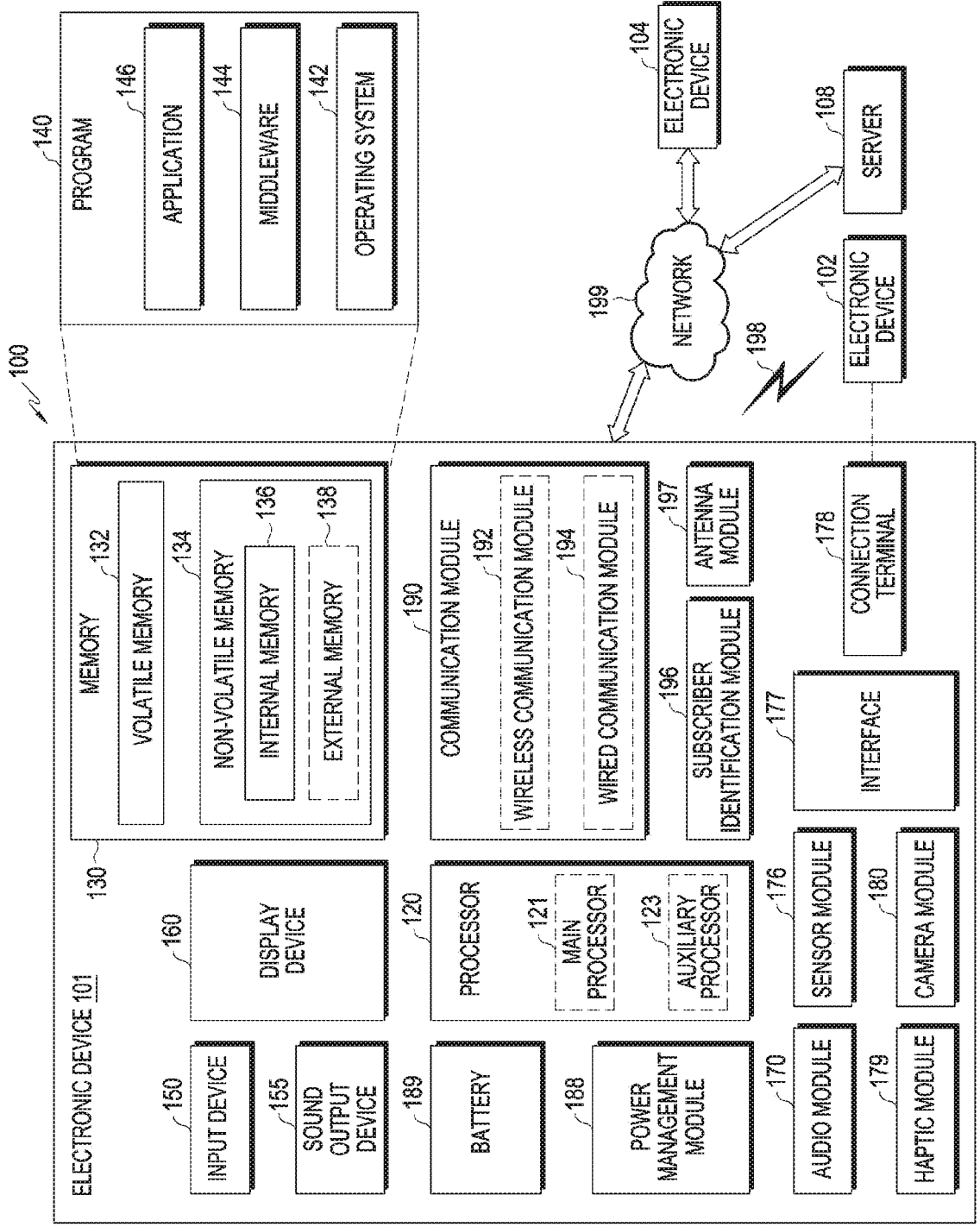
FIG. 1 is a schematic view illustrating an electronic device having a display with a bending area in a network environment according to various embodiments of the disclosure.

An electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, and/or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., a program 140) including one or more instructions that are stored in a storage medium (e.g., internal memory 136 or external memory 138) that is readable by a machine (e.g., an electronic device 101). For example, a processor (e.g., a processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

FIG. 1 is a block diagram illustrating the electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include the processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, and an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., the program 140) to control at least one other component (e.g., a hardware or software component) of the electronic device 101 connected to the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used only for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include a touch circuit or a pressure sensor adapted to measure the intensity of force incurred by a touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102) (e.g., a speaker or a headphone) wiredly or wirelessly connected to the electronic device 101.

The sensor module 176 may detect an operational state (e.g., power or temperature) of the electronic device 101 or an environmental state external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be connected to the external electronic device (e.g., the electronic device 102) wiredly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector), The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a wired communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single chip, or may be implemented as multi chips separate from each other.

According to an embodiment, the wireless communication module 192 may identify and authenticate the electronic device 101 in a communication network, such as the first network 198 or the second network 199, using user information stored in the SIM 196.

The antenna module 197 may transmit or receive a signal or power to or from the outside of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 connected to the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2A:
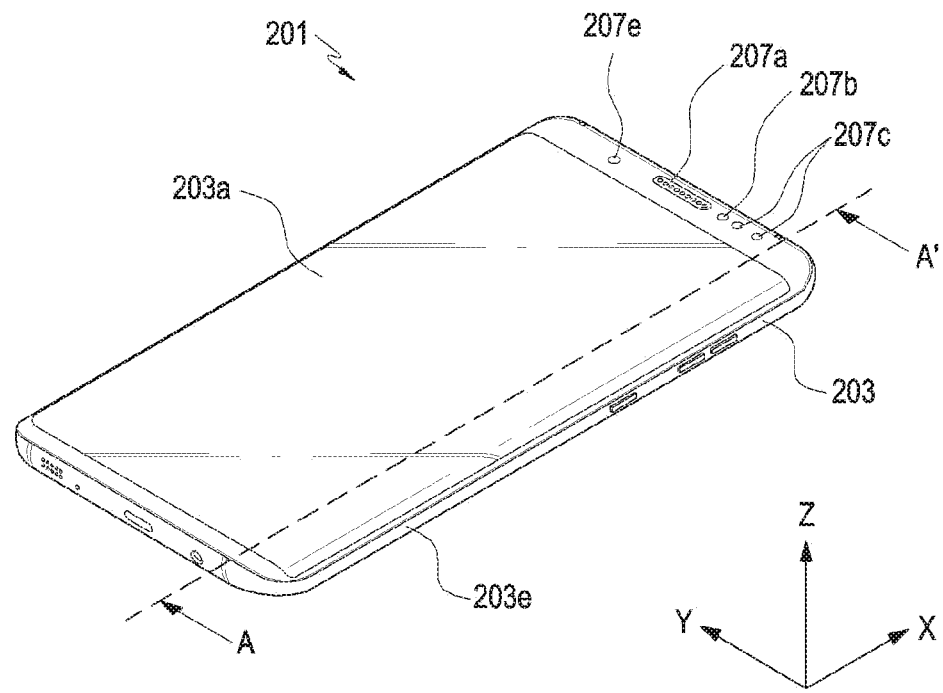
FIG. 2A is a front view illustrating an electronic device according to various embodiments of the disclosure.
Figure 2B:
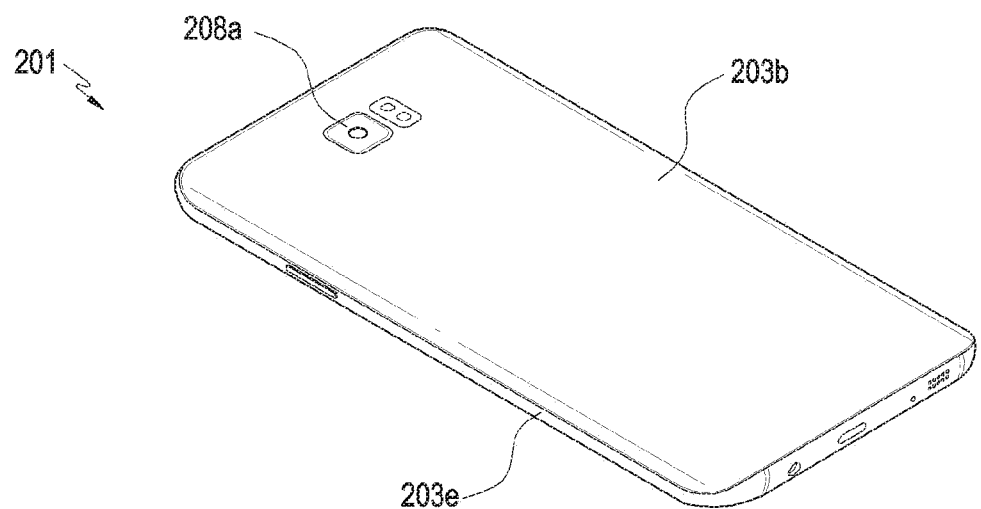
FIG. 2B is a rear view illustrating an electronic device according to various embodiments of the disclosure.

FIG. 2A is a front view illustrating an electronic device (e.g., the electronic device 101 in FIG. 1) according to various embodiments of the disclosure, and FIG. 2B is a rear view illustrating the electronic device according to various embodiments of the disclosure.

In FIG. 2A, in a 3-axis Cartesian coordinate system, 'Y' may represent the width direction of an electronic device 201, 'X' may represent the length direction of the electronic device 201, and 'Z' may represent the thickness direction of the electronic device 201.

Referring to FIGS. 2A and 2B, the electronic device 201 may include a housing 203. The housing 203 may include a first surface 203a facing in a first direction +Z, a second surface 203b facing in a second direction −Z opposite to the first direction +Z, and a side surface surrounding the space between the first surface 203a and the second surface 203b.

The housing 203 may be opened on the front surface thereof. A transparent cover (e.g., a window) may be installed to form at least a part of the first surface 203a, thereby covering the opened front surface of the housing 203. According to an embodiment, when seen from above the first surface 203a, the transparent cover may be disposed across the whole front surface of the electronic device 201.

According to an embodiment, a keypad including a mechanical button or a touch key may be provided in the lower-end area of the front surface (e.g., the first surface 203a) of the housing 203. The touch key may generate an input signal in response to contact from a user's body. According to an embodiment, the keypad may be configured to include only mechanical keys or touch keys. Various circuit devices, for example, the processor 120, the memory 130, the I/O interface 150, and the communication interface 170 illustrated in FIG. 1 may be accommodated inside the housing 203. Further, as the battery 189 is accommodated inside the housing 203, a power source may be secured.

According to an embodiment, a speaker 207e, a first camera 207a, an illuminance sensor 207b, or a proximity sensor 207c may be included in the upper-end area of the front surface (e.g., the first surface 203a) of the housing 203. According to an embodiment, a second camera 208a, a flash, or a camera may be included on the rear surface (e.g., the second surface 203b) of the housing 203.

Figure 3:
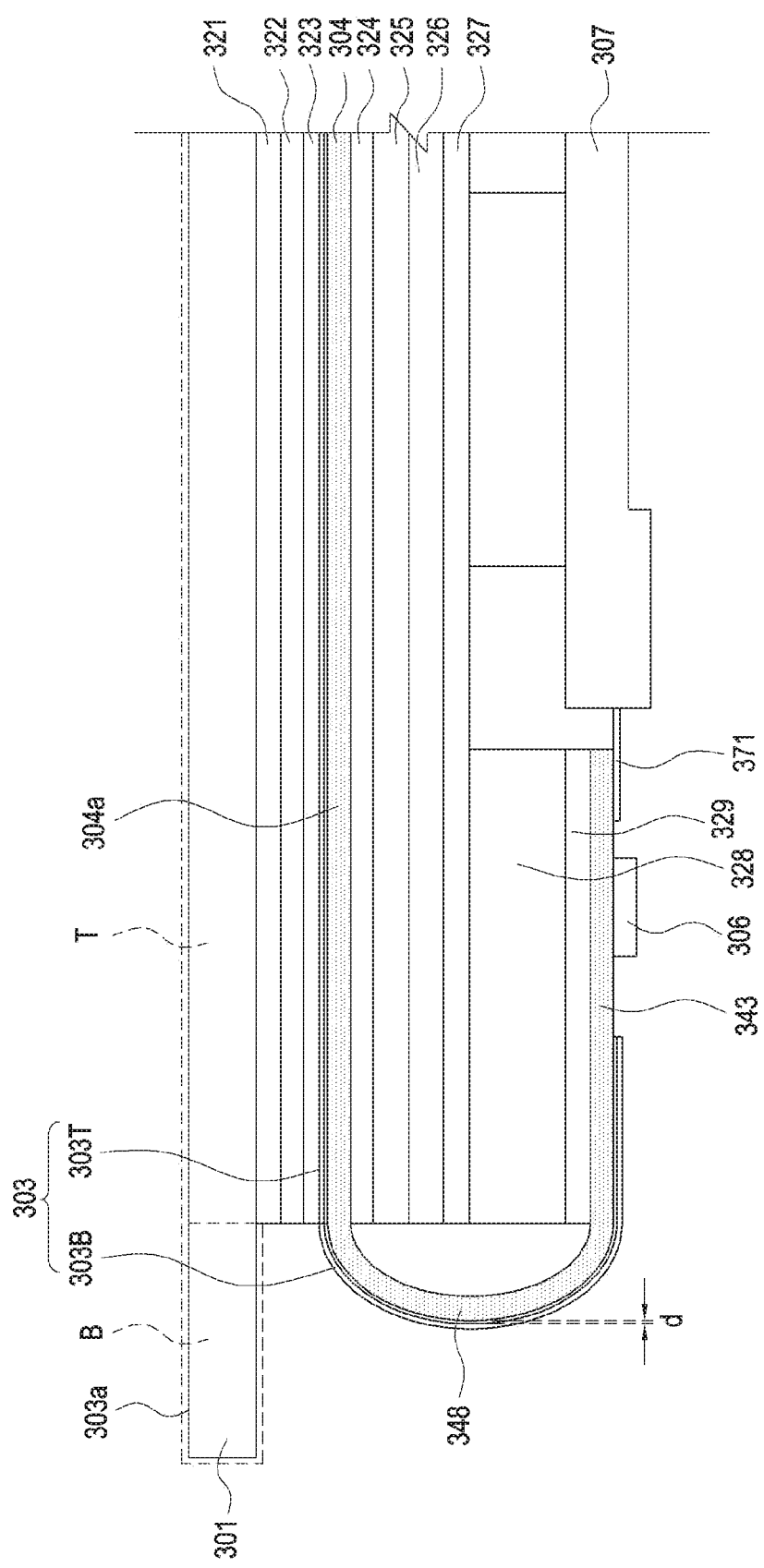
FIG. 3 is a sectional view illustrating the electronic device illustrated in FIG. 2A, taken along line A-A' according to one of various embodiments of the disclosure.

FIG. 3 is a sectional view illustrating the electronic device illustrated in FIG. 2A, taken along line A-A' according to one of various embodiments of the disclosure.

Referring to FIG. 3, an electronic device (e.g., the electronic device 201 in FIG. 2A), according to one of various embodiments of the disclosure, may include a window 301, transparent adhesive parts 321 and 323, a touch screen panel 303, and a display panel 304.

The window 301 may include a transparent area T and a bezel area B other than the transparent area T. The window 301 may be formed of a non-flexible material in order to form a part of the exterior of the electronic device (e.g., the electronic device 201 in FIG. 2A). According to an embodiment, the window 301 may be formed of glass. According to an embodiment, the window 301 may be formed of any of the various types of transparent resins, not limited to glass. The window 301 may include the first surface 303a facing in the first direction outside the electronic device (e.g., the electronic device 201 in FIG. 2A). According to an embodiment, the window 301 may be formed of a flexible resin, and may be flat or bent.

The touch screen panel 303 may include a second flexible substrate 303B extending from a partial portion 303T of the touch screen panel 303 (e.g., a partial layer of the touch screen panel 303) to the outside of the touch screen panel 303. The partial portion 303T of the touch screen panel 303 may be securely attached to the window 301. The second flexible substrate 303B may not be secured to the window 301. The partial portion 303T of the touch screen panel 303 may be attached onto the bottom surface of the window 301 by the transparent adhesive part 321. The transparent adhesive part 321 may be formed of an optical clear adhesive (OCA) film. According to an embodiment, the transparent adhesive part 321 may be formed of any various transparent and adhesive materials of various shapes, not limited to the OCA film. An edge of the transparent adhesive part 321 may correspond to a boundary between the transparent area T and the bezel area B. A plurality of electrodes may be disposed on the touch screen panel 303. For example, the plurality of electrodes may detect the position of a user's touch on the basis of a capacitance variation. According to an embodiment, the touch screen panel 303 may be disposed in any of various positions between the window 301 and the display panel 304, not limited to on the display panel 304.

According to an embodiment, the display panel 304 may include a first area 304a and a first flexible substrate 348. According to an embodiment, the first area 304a may be attached onto the bottom surface of the touch screen panel 303. The first flexible substrate 304 may not be fixed to the window 301. The display panel 304 may include an organic light emitting diode (OLED) device. The display panel 304 may include a light emitting layer (not shown). The light emitting layer may be a device that generates light to output a screen. The light emitting layer may be arranged on a display substrate. The display substrate may be fabricated of a resin, for example, polyimide (PI). According to an embodiment, the display substrate may be fabricated of any of various types of flexible resins, not limited to PI. According to an embodiment, the display substrate may be fabricated of a non-flexible material. The light emitting layer may include a cathode layer, an electron transfer layer, an output layer, a hole transfer layer, and an anode layer. For example, the cathode layer may be electrically connected to a circuit board of the electronic device, and thus generate a negative charge. The electron transfer layer may transmit the negative charge generated from the cathode layer to the output layer. The anode layer may be connected to the circuit board of the electronic device, and thus generate a positive charge. The hole transfer layer may transmit the positive charge generated from the anode layer to the output layer. The output layer may output light by the negative charge and the positive charge. According to an embodiment, the display panel 304 may include a thin film encapsulation (TFE) film on the light emitting layer. The display panel 304 may include a polarization part 322 disposed on the touch screen panel 303. According to an embodiment, the polarization part 322 may be attached to the touch screen panel 303 by the transparent adhesive part 323. According to an embodiment, the polarization part 322 may be disposed in any of various positions between the window 301 and the display panel 304, not limited to on the touch screen panel 303. The polarization part 322 may be a polarization function film, for example, a polyvinyl alcohol (PVA) film. The display panel 304 may contain tri-acetyl cellulose (TAC) (not shown) to protect the polarization part 322. According to an embodiment, the display panel 304 may be any of various types of display devices such as liquid crystal display (LCD), not limited to OLED.

According to an embodiment, the first flexible substrate 348 may be bent, extending from the first area 304a. A second wire (not shown) may be disposed on the first flexible substrate 348. The display panel 304 may be electrically connected to the circuit board via the second wire. According to an embodiment, the first flexible substrate 348 may be formed in a chip on plastic (COP) structure. For example, the section of the bent first flexible substrate 348 may be shaped into an oval or semi-circle. The display panel 304 may include a fifth area 343. The fifth area 343 may face the first area 304a, extending from the first flexible substrate 348. A touch-and-display driver integration (TDDI) circuit 306 may be disposed in the fifth area 343 in order to control the display panel 304 or the touch screen panel 303. The TDDI circuit 306 may be electrically connected to a circuit board 307 via a connecting line 371. According to an embodiment, the TDDI circuit 306 may be disposed on the circuit board 307, not limited to within the fifth area 343.

The TDDI circuit 306 may be configured to provide display information by controlling a plurality of pixels included in the display panel 304. According to an embodiment, the first flexible substrate 348 may include a separate flexible circuit board connecting the first area 304a to the fifth area 343. According to an embodiment, the TDDI circuit 306 may be disposed on the separate flexible circuit board, forming a COF structure. According to an embodiment, the electronic device (e.g., the electronic device 201 in FIG. 2A) may further include protection films 324 and 329. The protection film 324 and 329 may include a first polymer layer 324 and a second polymer layer 329. The first polymer layer 324 may be attached under the display panel 304. The first polymer layer 324 may protect the display panel 304. According to an embodiment, a black layer 325, a support layer 326, and a shielding layer 327 may be sequentially stacked under the first polymer layer 324. The black layer 325 may shield light generated from the display panel 304 or light incident from the outside. The black layer 325 may be an embossed layer with a rugged pattern formed thereon. The support layer 326 may absorb an external impact. For example, the support layer 36 may be formed of sponge. The shielding layer 327 may shield electromagnetic waves introduced from or discharged to the display panel 304. According to an embodiment, the shielding layer 327 may distribute heat generated from the display panel 304. The shielding layer 327 may be formed of copper (Cu) or graphite. According to an embodiment, an adhesive part 328 may be disposed between the first area 304a and the fifth area 343. According to an embodiment, the second polymer layer 329 may be disposed between the adhesive part 328 and the fifth area 343.

According to an embodiment, the second flexible substrate 303B may be bent. The second flexible substrate 303B may be formed in a COP structure. For example, the second flexible substrate 303B may be bent along the outer side surface of the first flexible substrate 348, surrounding the side surface of the first flexible substrate 348 of the display panel 304. According to an embodiment, the second flexible substrate 303B may include a driving circuit area and a bending area. A driving circuit 306 may be disposed in the driving circuit area. The bending area may be bent with respect to the touch screen panel 304. The second flexible substrate 303B may surround the first flexible substrate 348, apart from the first flexible substrate 348 by a gap d of about 0.04 mm. According to an embodiment, an adhesive may be filled between the second flexible substrate 303B and the first flexible substrate 348. The second flexible substrate 303B may be disposed within the bezel area B. According to an embodiment, the second flexible substrate 303B may be bent, starting from a position which corresponds to the edge of the transparent adhesive part 321. According to an embodiment, the starting position of the bend of the second flexible substrate 303B may be adjacent to the position which corresponds to the edge of the transparent part 321, not limited to the position which corresponds to the edge of the transparent part 321.

Figure 4A:
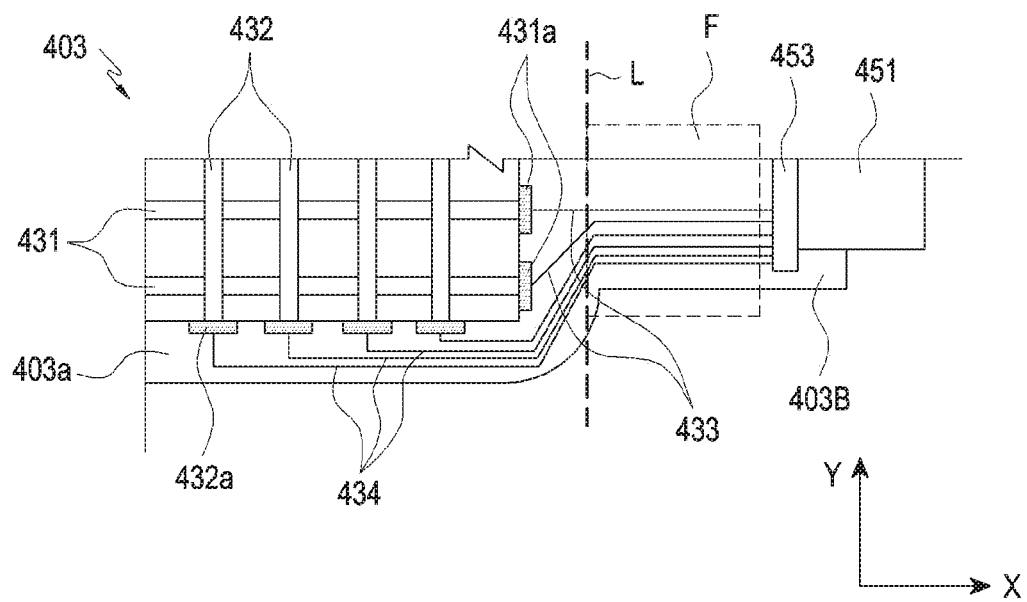
FIG. 4A is a plan view illustrating a touch screen panel according to one of various embodiments of the disclosure.
Figure 4B:
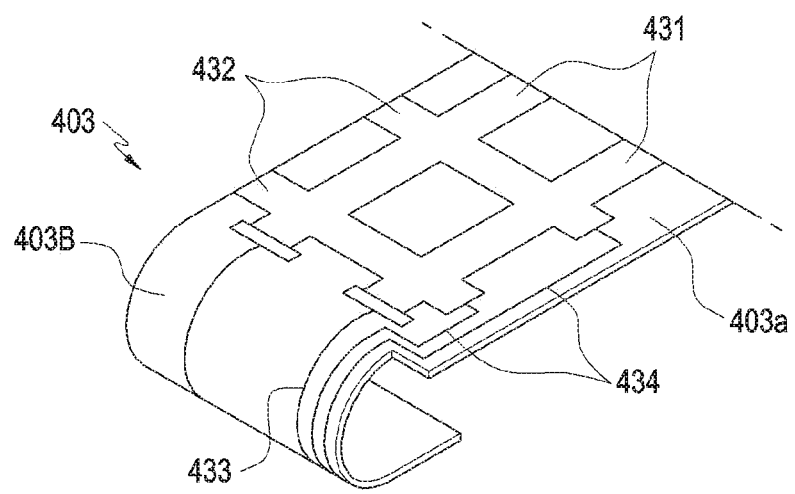
FIG. 4B is a perspective view illustrating a touch screen panel according to one of various embodiments of the disclosure.

FIG. 4A is a plan view illustrating a touch screen panel (e.g., the touch screen panel 303 in FIG. 3) included in an electronic device (e.g., the electronic device 201 in FIG. 2A) according to one of various embodiments of the disclosure, and FIG. 4B is a perspective view illustrating the touch screen panel according to one of various embodiments of the disclosure.

Referring to FIGS. 4A and 4B, a touch screen panel 403 (e.g., the touch screen panel 303 in FIG. 3) included in an electronic device (e.g., the electronic device 201 in FIG. 2A), according to one of various embodiments of the disclosure, may include a flexible touch substrate 403a, a plurality of electrodes 431 and 432, and first wires 433 and 434. The flexible touch substrate 403a may be formed of at least one of poly carbonate, cyclo olfin polymer, PI, or polyethylene terephthalate (PET). The plurality of electrodes 431 and 432 may be arranged on the flexible touch substrate 403a (e.g., the partial layer 303T of the touch screen panel 303 in FIG. 3). The plurality of electrodes 431 and 432 may generate electrical signals in response to a touch input to a transparent area (e.g., the transparent area T in FIG. 3) of a window (e.g., the window 301 in FIG. 3).

According to an embodiment, the plurality of electrodes 431 and 432 may include a plurality of first electrodes 431 and a plurality of second electrodes 432. The plurality of first electrodes 431 may be arranged along a first axis (X axis), and the plurality of second electrodes 432 may be arranged along a second axis (Y axis) substantially perpendicular to the first axis (X axis). According to an embodiment, the plurality of electrodes 431 and 432 may be arranged in various manners on the flexible touch substrate 403a, not limited to along the first axis (X axis) and the second axis (Y axis).

According to an embodiment, first junction pads 431a and second junction pads 432a may be arranged on the flexible touch substrate 403a. The first junction pads 431a may be electrically connected to the plurality of first electrodes 431. The second junction pads 432a may be electrically connected to the plurality of second electrodes 432.

According to an embodiment, the first wires 433 and 434 may be arranged on the second flexible substrate 403B. The first wires 433 and 434 may be formed of at least one of a copper alloy, a silver alloy, or an aluminum alloy. According to an embodiment, the first wires 433 and 434 may be formed of any of various conductive and highly flexible materials. The first wires 433 and 434 may include third conductive lines 433 and fourth conductive lines 434. The third conductive lines 433 may be electrically connected to the plurality of first electrodes 431 via the first junction pads 431a. The fourth conductive lines 434 may be electrically connected to the plurality of second electrodes 432 via the second junction pads 432a. According to an embodiment, the first wires 433 and 434 may be arranged in parallel on the second flexible substrate 403B. For example, the first wires 433 and 434 may be arranged in a line direction on the second flexible substrate 403B.

According to an embodiment, a third junction pad 453 may be disposed on the second flexible substrate 403B. The third junction pad 453 may be connected to the first wires 433 and 434. According to an embodiment, the second flexible substrate 403B may be connected to a circuit board (e.g., the circuit board 307 in FIG. 3) of the electronic device. At least one control IC 451 may be included on the circuit board (e.g., the circuit board 307 in FIG. 3) of the electronic device. The at least one control IC 451 may control the driving of the touch screen panel. According to an embodiment, the at least one control IC 451 may be a touch screen panel control IC for driving the touch screen panel. According to an embodiment, the at least one IC 451 may be a processor (e.g., the processor 120 in FIG. 1) of the electronic device. According to an embodiment, the second flexible substrate 403B may be connected to the circuit board (e.g., the circuit board 307 in FIG. 3), bent together with the first wires 433 and 434. According to an embodiment, the second flexible substrate 403B may be bent, starting from a first bending line L. The second flexible substrate 403B may include a bending area F.

Figure 5A:
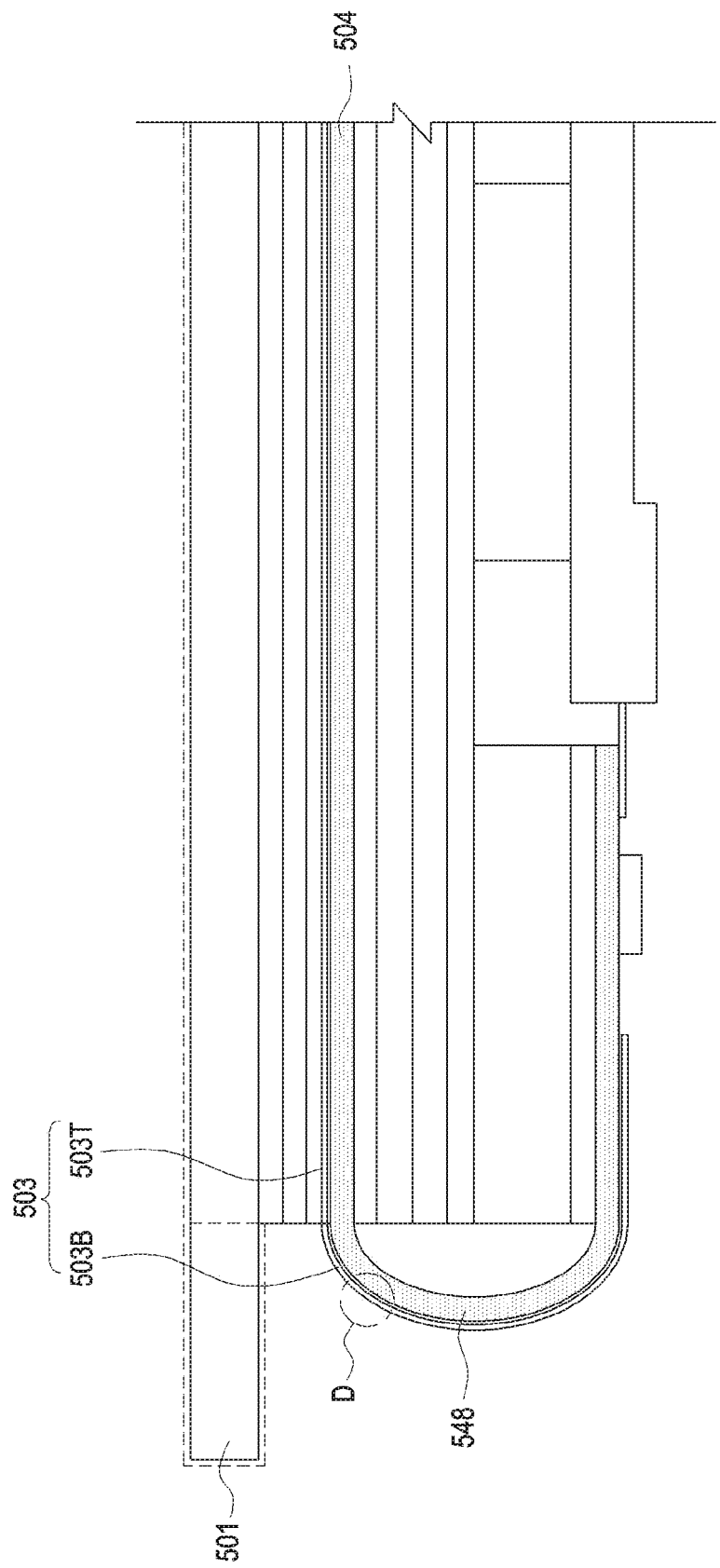
FIG. 5A is a sectional view illustrating the electronic device illustrated in FIG. 2A, taken along line A-A' according to another of various embodiments of the disclosure.
Figure 5B:
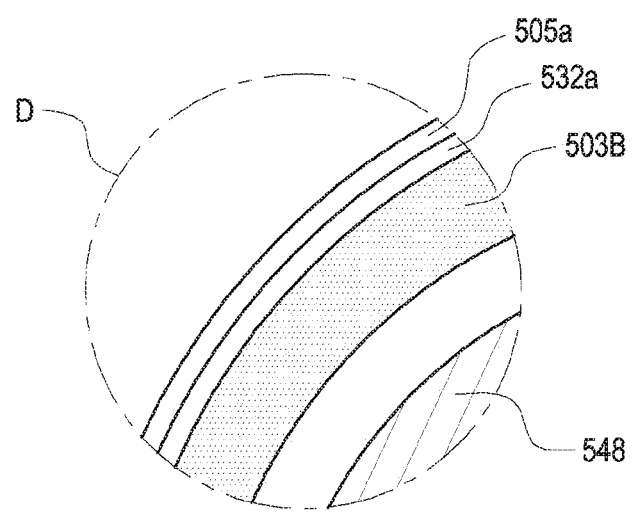
FIG. 5B is an enlarged view illustrating part D illustrated in FIG. 5A according to another of various embodiments of the disclosure.

FIG. 5A is a sectional view illustrating the electronic device illustrated in FIG. 2A, taken along line A-A' according to another of various embodiments of the disclosure, and FIG. 5B is an enlarged view illustrating part D illustrated in FIG. 5A according to another of various embodiments of the disclosure.

Referring to FIGS. 5A and 5B, an electronic device (e.g., the electronic device 201 in FIG. 2A), according to another of various embodiments of the disclosure, may include a window 501 (e.g., the window 301 in FIG. 3), a touch screen panel 503 (e.g., the touch screen panel 303 in FIG. 3), and a display panel 504 (e.g., the display panel 304 in FIG. 3). According to an embodiment, first wires 532a (e.g., the first wires 432 and 433 in FIG. 4A) may be arranged on an outer side surface of the second flexible substrate 503B.

According to an embodiment, a protection member 505a may be disposed on the bent second flexible substrate 503B. The protection member 505a may be a transparent photosensitive film (TPF). The protection member 505a may be coated on the first wires 532a. If light (e.g., ultraviolet (UV) light) is projected onto at least a partial area of the protection member 505a, the internal chemical structure of the at least partial area may be changed, thus revealing adhesiveness. The protection member 505a may contain at least one of a binder polymer, a photopolymerizable compound with an ethylenically unsaturated bond, or a photopolymerization initiator. According to an embodiment, the protection member 505a may be placed only on the first wires 532a by an exposure process. The protection member 505a may prevent the formation of a crack on the first wires 532a. The protection member 505a may protect the first wires 532a against an impact. According to an embodiment, as the protection member 505a is coated on the bent second flexible substrate 503B, the protection member 505a may align the first wires 532a to a neutral plane, thus preventing compression or tension from causing damage to the first wires 532a. According to an embodiment, the protection member 505a may be formed as thick as positioning the first wires 532a on the neutral plane.

Figure 6A:
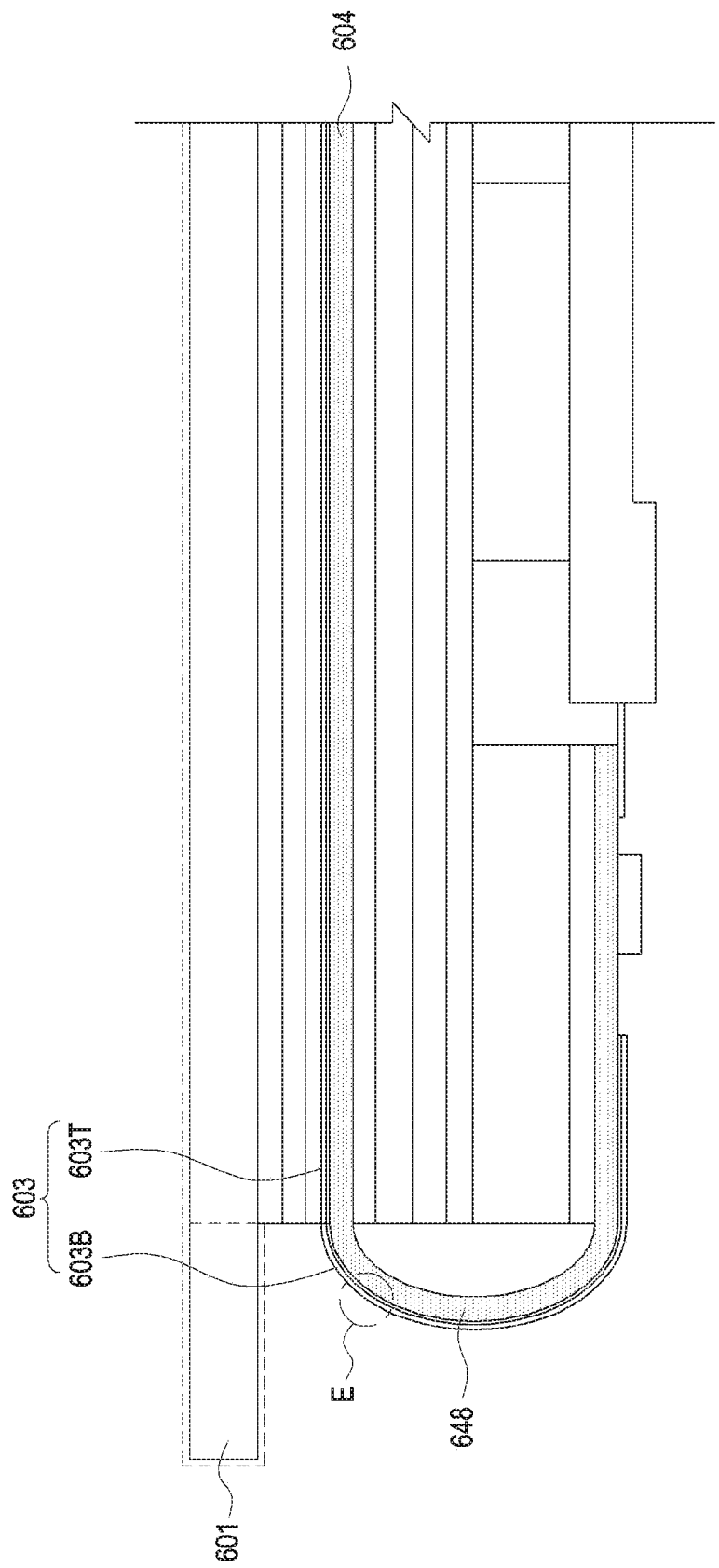
FIG. 6A is a sectional view illustrating the electronic device illustrated in FIG. 2A, taken along line A-A' according to another of various embodiments of the disclosure.
Figure 6B:
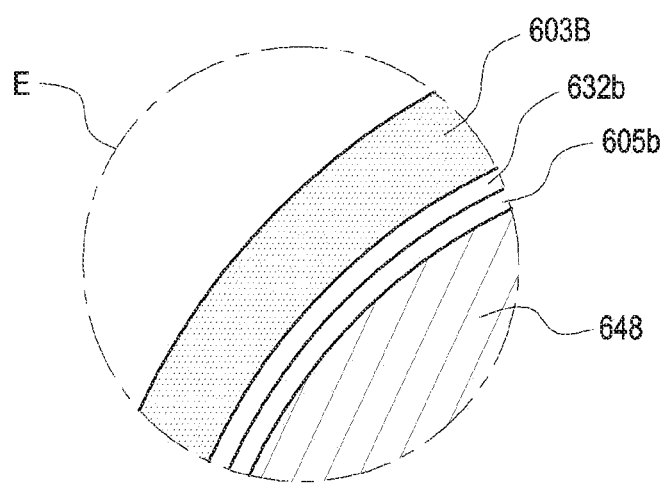
FIG. 6B is an enlarged view illustrating part E illustrated in FIG. 6A according to another of various embodiments of the disclosure.

FIG. 6A is a sectional view illustrating the electronic device illustrated in FIG. 2A, taken along line A-A' according to another of various embodiments of the disclosure, and FIG. 6B is an enlarged view illustrating part E illustrated in FIG. 6A according to another of various embodiments of the disclosure.

Referring to FIGS. 6A and 6B, an electronic device (e.g., the electronic device 201 in FIG. 2A), according to another of various embodiments of the disclosure, may include a window 601 (e.g., the window 501 in FIG. 5A), a touch screen panel 603 (e.g., the touch screen panel 503 in FIG. 5A), and a display panel 604 (e.g., the display panel 504 in FIG. 5A). According to an embodiment, first wires 632b may be arranged on an inner surface of a second flexible substrate 603B. According to an embodiment, a protection film 605b may be coated on the first wires 632b. The protection member 605b may be a TPF. According to an embodiment, as the protection member 605b is provided between the second flexible substrate 603b and a first flexible substrate 648, the second flexible substrate 603B may be supported by the first flexible substrate 648.

Figure 7A:
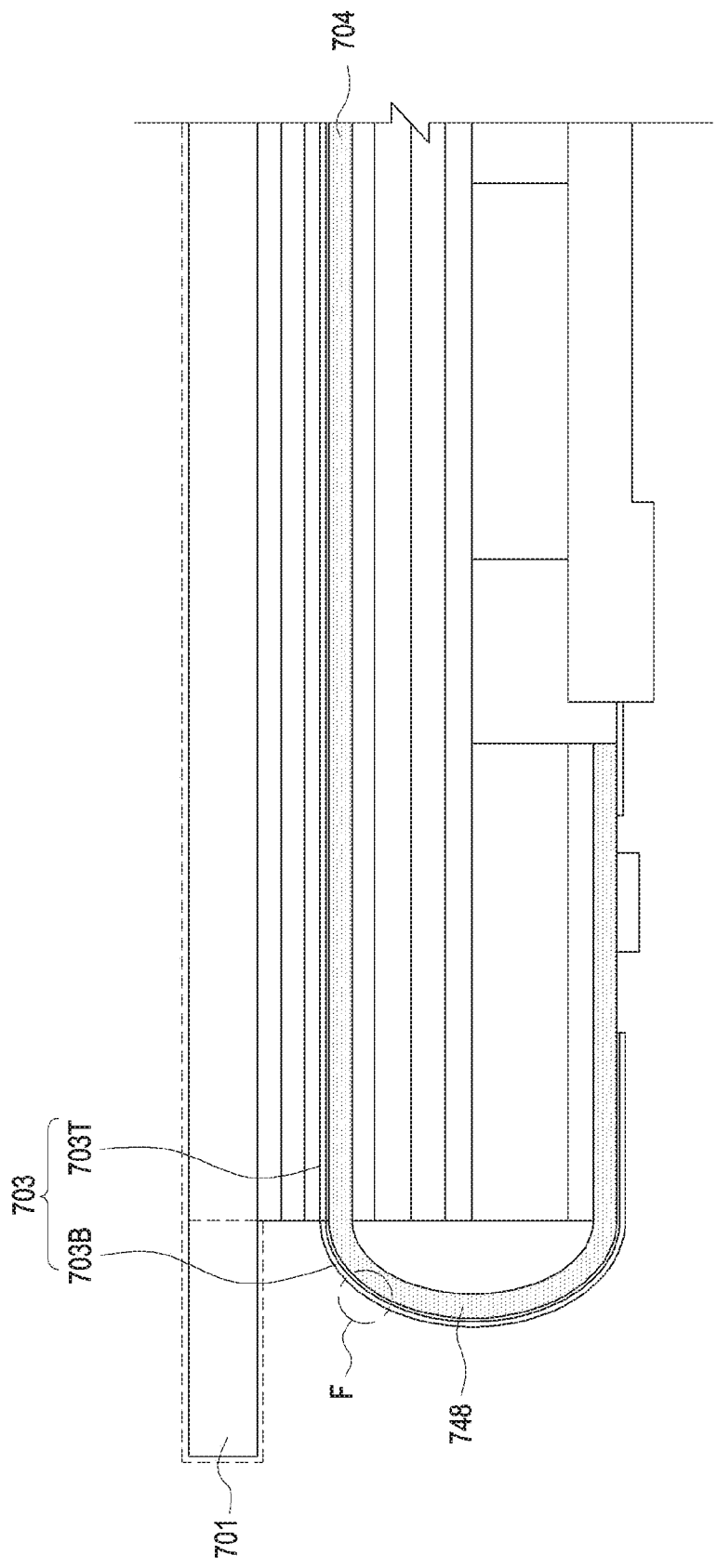
FIG. 7A is a sectional view illustrating the electronic device illustrated in FIG. 2A, taken along line A-A' according to another of various embodiments of the disclosure.
Figure 7B:
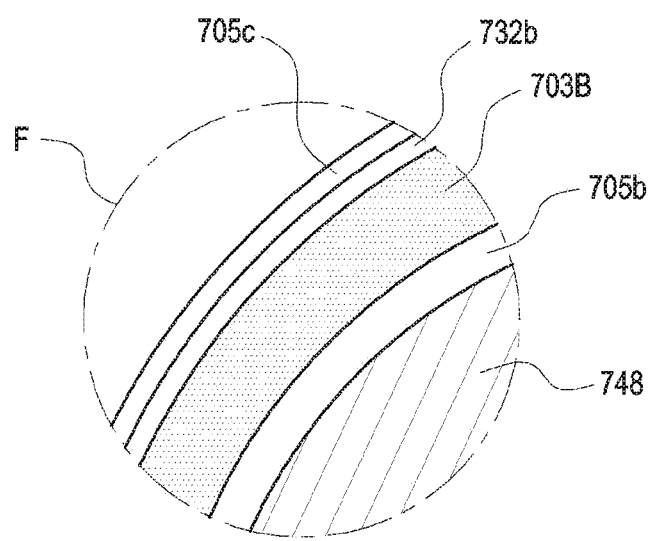
FIG. 7B is an enlarged view illustrating part F illustrated in FIG. 7A according to another of various embodiments of the disclosure.

FIG. 7A is a sectional view illustrating the electronic device illustrated in FIG. 2A, taken along line A-A' according to another of various embodiments of the disclosure, and FIG. 7B is an enlarged view illustrating part F illustrated in FIG. 7A according to another of various embodiments of the disclosure.

Referring to FIGS. 7A and 7B, an electronic device (e.g., the electronic device 201 in FIG. 2A), according to another of various embodiments of the disclosure, may include a window 701 (e.g., the window 601 in FIG. 6A), a touch screen panel 703 (e.g., the touch screen panel 603 in FIG. 6A), and a display panel 704 (e.g., the display panel 604 in FIG. 6A). According to an embodiment, first wires 732b may be arranged on an outer side surface of a second flexible substrate 703B. According to an embodiment, a protection member 705b may be disposed on the first wires 732b. The protection member 705b may be a TPF. According to an embodiment, as the protection member 705b is provided between the second flexible substrate 703B and a first flexible substrate 748, the second flexible substrate 703B may be supported by the first flexible substrate 748. The protection member 705b may prevent an external shock from causing mutual shock or friction between the first flexible substrate 748 and the second flexible substrate 703B.

Figure 8:
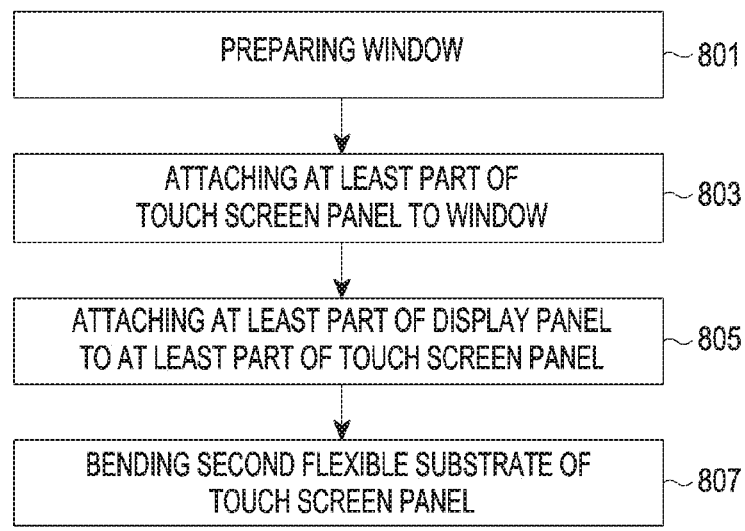
FIG. 8 is a flowchart illustrating a method for fabricating a display in an electronic device according to various embodiments of the disclosure.

FIG. 8 is a flowchart illustrating a method for fabricating a display according to various embodiments of the disclosure.

Referring to FIG. 8, a window (e.g., the window 301 in FIG. 3) may be prepared in operation 801.

According to an embodiment, at least a part of a touch screen panel (e.g., the touch screen panel 303 in FIG. 3) may be attached to the window (e.g., the window 301 in FIG. 3) in operation 803. According to an embodiment, the touch screen panel (e.g., the touch screen panel 303 in FIG. 3) may include a plurality of electrodes which generate an input signal in response to a user's touch. According to an embodiment, the window may include a transparent area and a bezel area surrounding the transparent area (e.g., the transparent area T and the bezel area B surrounding the transparent area T in FIG. 3). The touch screen panel (e.g., the touch screen panel 303 in FIG. 3) may be securely attached to the transparent area of the window by a transparent adhesive.

According to an embodiment, at least a part of a display panel (e.g., the display panel 304 in FIG. 3) may be attached to at least a part of the touch screen panel (e.g., the touch screen panel 303 in FIG. 3) in operation 805. For example, at least a part (e.g., the first area 304a in FIG. 3) of the display panel may be attached onto the bottom surface of the touch screen panel (e.g., the touch screen panel 303 in FIG. 3) by a transparent adhesive. According to an embodiment, another part (e.g., the first flexible substrate 348 in FIG. 3) of the display panel may be bent, without being attached to the window (e.g., the window 301 in FIG. 3), and connected to a circuit board (e.g., the circuit board 307 in FIG. 3) of an electronic device.

A second flexible substrate (e.g., the second flexible substrate 303B in FIG. 3) of the touch screen panel (e.g., the touch screen panel 303 in FIG. 3) may be bent in operation 807. The second flexible substrate (e.g., the second flexible substrate 303B in FIG. 3) may be bent and connected to the circuit board (e.g., the circuit board 307 in FIG. 3) of the electronic device. According to an embodiment, the second flexible substrate (e.g., the second flexible substrate 303B in FIG. 3) may be bent, surrounding the outer side surface of a first flexible substrate (e.g., the first flexible substrate 348 in FIG. 3) of the display panel (e.g., the display panel 304 in FIG. 3).

Figure 9A:
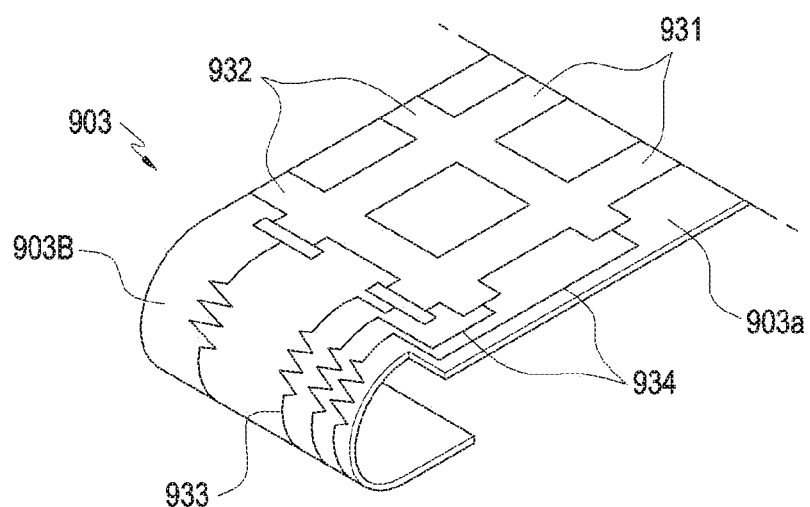
FIG. 9A is a perspective view illustrating a touch screen panel according to another of various embodiments of the disclosure.
Figure 9B:
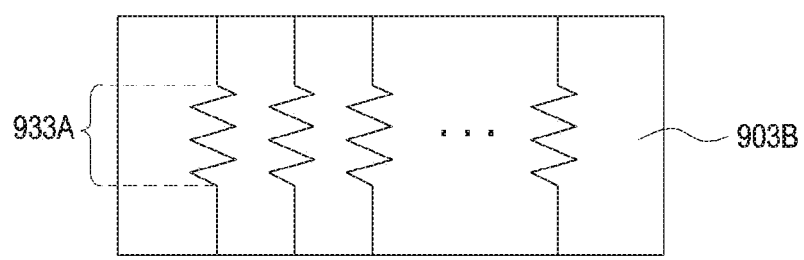
FIG. 9B is a front view illustrating a second flexible substrate in a touch screen panel according to another of various embodiments of the disclosure.

FIG. 9A is a perspective view illustrating a touch screen panel (e.g., the touch screen panel 303 in FIG. 3) according to another of various embodiments of the disclosure, and FIG. 9B is a front view illustrating a second flexible substrate 903B in the touch screen panel according to another of various embodiments of the disclosure.

Referring to FIGS. 9A and 9B, a touch screen panel (e.g., the touch screen panel 303 in FIG. 3), according to another of various embodiments of the disclosure may include a flexible touch substrate 903a (e.g., the flexible touch substrate 403a in FIG. 4A), a plurality of electrodes 931 and 932 (e.g., the plurality of electrodes 431 and 432 in FIG. 4A), and first wires 933 and 934 (e.g., the first wires 433 and 434 in FIG. 4A).

According to an embodiment, the first wires 933 and 934 may be arranged in a zigzag pattern (e.g., 933A in FIG. 9B) on the second flexible substrate 903B. The zigzag arrangement of the first wires 933 and 934 may prevent the generation of tensile force on the first wires 933 and 934 while the second flexible substrate 903B is bent.

According to an embodiment, the first wires 933 and 934 may be arranged in any of various shapes such as a linear arrangement and then combining: an arrangement with an increasing width on the second flexible substrate 903B, an arrangement in a slanted line, or an arrangement in the form of a wave, not limited to the zigzag pattern on the second flexible substrate 903B.

Figure 10:
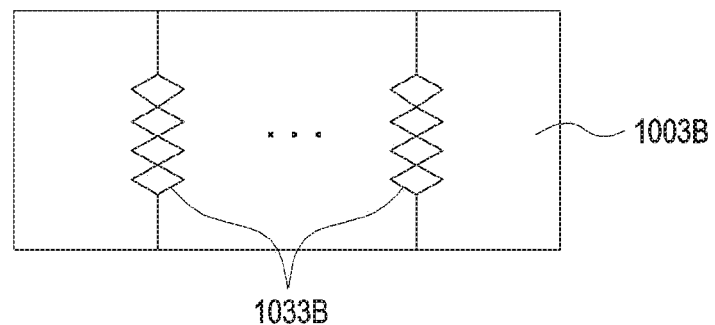
FIG. 10 is a front view illustrating a second flexible substrate in a touch screen panel according to another of various embodiments of the disclosure.

FIG. 10 is a front view illustrating a second flexible substrate (e.g., the second flexible substrate 303B in FIG. 3) of a touch screen panel (e.g., the touch screen panel 303) according to another of various embodiments of the disclosure.

Referring to FIG. 10, a touch screen panel (e.g., the touch screen panel 303), according to another of various embodiments of the disclosure, may include first wires 1033B. The first wires 1033B may be arranged in a diamond form. As the first wires 1033B are arranged in a diamond form, an electrical connection may be maintained even though the first wires 1033B are partially damaged.

Figure 11:
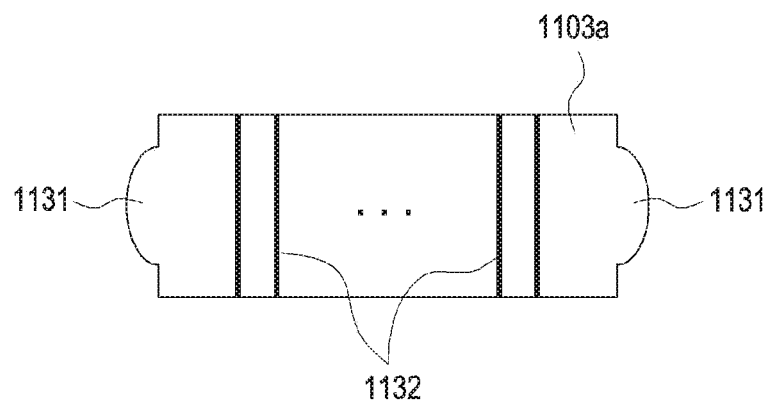
FIG. 11 is a front view illustrating a second flexible substrate in a touch screen panel according to another of various embodiments of the disclosure.

FIG. 11 is a front view illustrating a second flexible substrate (e.g., the second flexible substrate 303B) of a touch screen panel (e.g., the touch screen panel 303) according to another of various embodiments of the disclosure.

Referring to FIG. 11, a touch screen panel (e.g., the touch screen panel 303), according to another of various embodiments of the disclosure, may include a second flexible substrate 1103a including first wires 1132 (e.g., the first wires 432 and 433 in FIG. 4A). The second flexible substrate 1103a may include protrusions 1131 which extend from both side ends of the second flexible substrate 1103a. The protrusions 1131 may be formed in an oval or an of various polygonal shapes. Even though a crack is formed on the second flexible substrate 1103a, the protrusions 1131 may slow the progress of the crack to the first wires 1132. For example, the protrusions 1131 may slow extension of a crack to the first wires 1132, which is generated when the second flexible substrate 1103a is bent, during the attachment of a display panel (e.g., the display panel 304 in FIG. 3) to the touch screen panel (e.g., the touch screen panel 303 in FIG. 3), or upon the application of an external shock.

Figure 12:
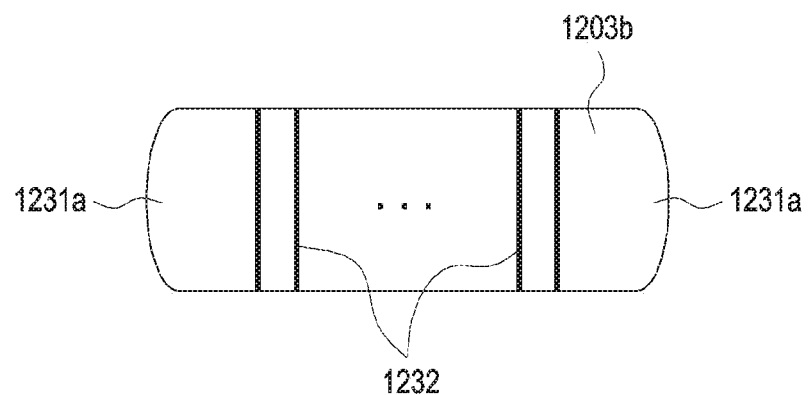
FIG. 12 is a front view illustrating a second flexible substrate in a touch screen panel according to another of various embodiments of the disclosure.

FIG. 12 is a front view illustrating a second flexible substrate (e.g., the second flexible substrate 303B in FIG. 3) of a touch screen panel (e.g., the touch screen panel 303 in FIG. 3) according to another of various embodiments of the disclosure.

Referring to FIG. 12, a touch screen panel (e.g., the touch screen panel 303 in FIG. 3), according to another of various embodiments of the disclosure, may include a second flexible substrate 1203b including first wires 1232. The second flexible substrate 1203b may include extension portions 1231a surrounding both side ends of the second flexible substrate 1203b. The extension portions 1231a may be oval. Even though a crack is formed on the second flexible substrate 1203b, the extension portions 1231a may slow the progress of the crack to the first wires 1232. For example, the extension portions 1231a may slow extension of a crack to the first wires 1232, which is generated when the second flexible substrate 1203b is bent, during the attachment of a display panel (e.g., the display panel 304 in FIG. 3) to the touch screen panel (e.g., the touch screen panel 303 in FIG. 3), or upon the application of an external shock.

Figure 13:
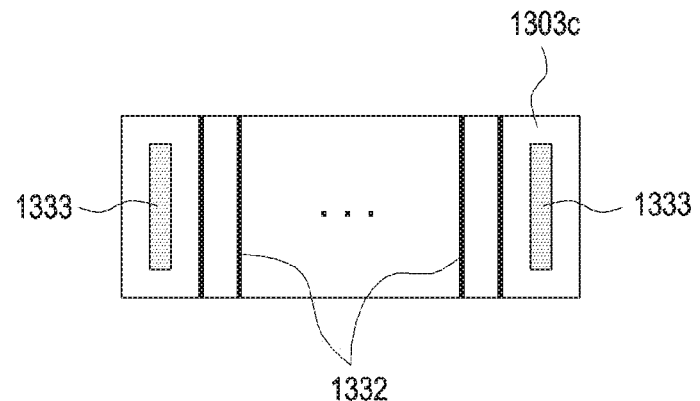
FIG. 13 is a front view illustrating a second flexible substrate in a touch screen panel according to another of various embodiments of the disclosure.

FIG. 13 is a front view illustrating a second flexible substrate (e.g., the second flexible substrate 303B in FIG. 3) of a touch screen panel (e.g., the touch screen panel 303 in FIG. 3) according to another of various embodiments of the disclosure.

Referring to FIG. 13, a touch screen panel (e.g., the touch screen panel 303 in FIG. 3), according to another of various embodiments of the disclosure, may include a second flexible substrate 1303c including first wires 1332. The second flexible substrate 1303c may include openings 1333. The openings 1333 may be located near both side ends of the second flexible substrate 1303c. Even though a crack is formed on the second flexible substrate 1303c, the openings 1333 may slow the progress of the crack to the first wires 1332. For example, the openings 1333 may slow extension of a crack to the first wires 1332, which is generated when the second flexible substrate 1303c is bent, during the attachment of a display panel (e.g., the display panel 304 in FIG. 3) to the touch screen panel (e.g., the touch screen panel 303 in FIG. 3), or upon the application of an external shock.

Figure 14:
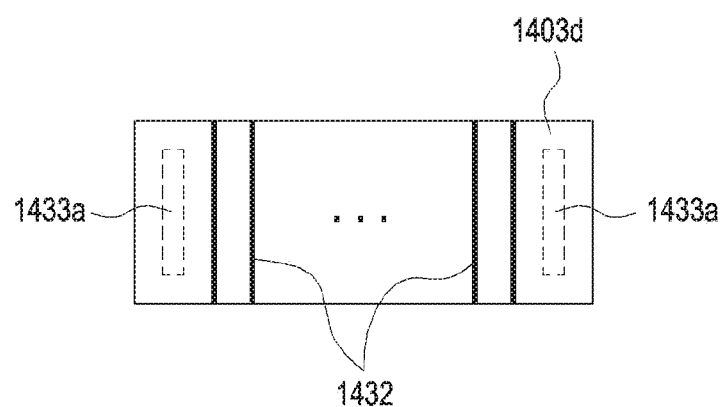
FIG. 14 is a front view illustrating a second flexible substrate in a touch screen panel according to another of various embodiments of the disclosure.

FIG. 14 is a front view illustrating a second flexible substrate (e.g., the second flexible substrate 303B in FIG. 3) of a touch screen panel (e.g., the touch screen panel 303 in FIG. 3) according to another of various embodiments of the disclosure.

Referring to FIG. 14, a touch screen panel (e.g., the touch screen panel 303 in FIG. 3). according to another of various embodiments of the disclosure. may include a second flexible substrate 1403d including first wires 1432. The second flexible substrate 1403d may include a plurality of layers. Grooves 1433a may be formed inside the second flexible substrate 1403d. The grooves 1433a may be located near both side ends of the flexible touch substrate 1403d. Even though a crack is formed on the second flexible substrate 1403d, the grooves 1433a may slow the progress of the crack to the first wires 1432. For example, the grooves 1433a may slow extension of a crack to the first wires 1432, which is generated when the second flexible substrate 1403d is bent, during the attachment of a display panel (e.g., the display panel 304 in FIG. 3) to the touch screen panel (e.g., the touch screen panel 303 in FIG. 3), or upon the application of an external shock.

Figure 15:
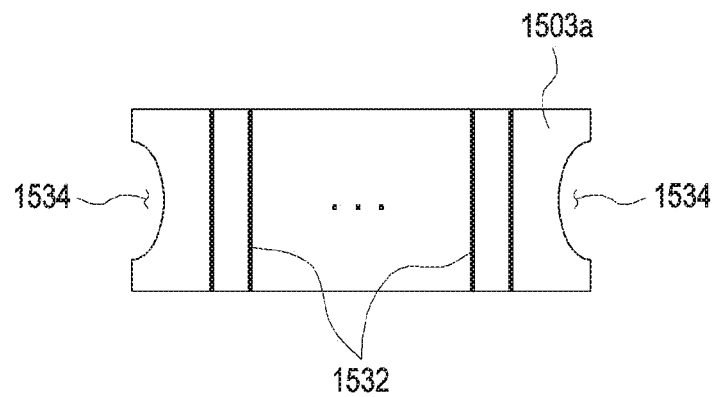
FIG. 15 is a front view illustrating a second flexible substrate in a touch screen panel according to another of various embodiments of the disclosure.

FIG. 15 is a front view illustrating a second flexible substrate (e.g., the second flexible substrate 303B in FIG. 3) of a touch screen panel (e.g., the touch screen panel 303 in FIG. 3) according to another of various embodiments of the disclosure.

Referring to FIG. 15, a touch screen panel (e.g., the touch screen panel 303 in FIG. 3), according to another of various embodiments of the disclosure, may include a second flexible substrate 1503a including first wires 1532. The second flexible substrate 1503a may include second grooves 1534 at both side ends of the second flexible substrate 1503a. The second grooves 1534 may be oval. The second grooves 1534 may enable active bending of the second flexible substrate 1503a.

Figure 16:
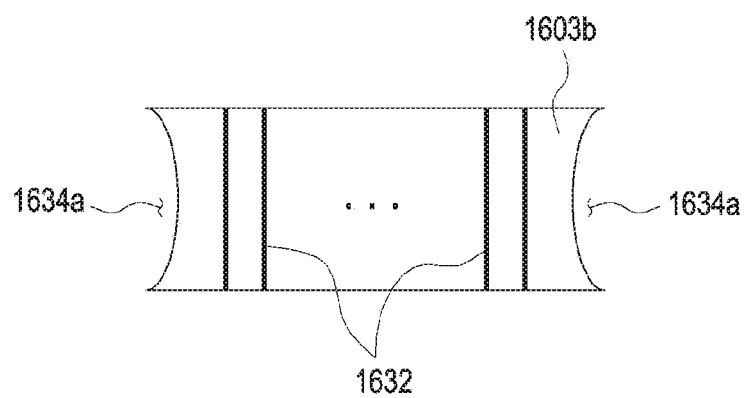
FIG. 16 is a front view illustrating a second flexible substrate in a touch screen panel according to another of various embodiments of the disclosure.

FIG. 16 is a front view illustrating a second flexible substrate (e.g., the second flexible substrate 303B in FIG. 3) of a touch screen panel (e.g., the touch screen panel 303 in FIG. 3) according to another of various embodiments of the disclosure.

Referring to FIG. 16, a touch screen panel (e.g., the touch screen panel 303 in FIG. 3), according to another of various embodiments of the disclosure, may include a second flexible substrate 1603b including first wires 1632. The second flexible substrate 1603b may include third grooves 1634a at both side ends of the second flexible substrate 1603b. The third grooves 1634a may be formed across the whole of both side ends of the second flexible substrate 1603b. The third grooves 1634a may be oval. The third grooves 1634a may enable active bending of the second flexible substrate 1603b.

According to various embodiments of the disclosure, a display may include a touch screen panel, a display panel disposed under the touch screen panel and including a first flexible substrate, a driving circuit configured to drive the touch screen panel or the display panel, and a second flexible substrate extending from a partial portion of the touch screen panel to the outside of the touch screen panel. The second flexible substrate may include a driving circuit area in which the driving circuit is disposed, at least one first wire connected to the driving circuit and the touch screen panel, and a bending area bent with respect to the touch screen panel.

According to an embodiment, the bending area of the second flexible substrate may be bent to surround the first flexible substrate.

According to an embodiment, the bending area may include a protection member configured to protect the at least one first wire.

According to an embodiment, the second flexible substrate may include a COP.

According to an embodiment, the display may further include a window disposed on the touch screen panel, and may include a transparent area and a bezel area surrounding at least a part of the transparent area. The bending area may be disposed under the bezel area.

According to an embodiment, the second flexible substrate may be bent, thereby being separate from the window.

According to an embodiment, at least one second wire may be disposed on the first flexible substrate.

According to an embodiment, a plurality of electrodes may be arranged on the touch screen panel, and the plurality of electrodes may include a plurality of first electrode patterns arranged along a first axis, and a plurality of second electrode patterns arranged along a second axis substantially perpendicular to the first axis.

According to an embodiment, the at least one first wire may include third conductive lines connected to the plurality of first electrodes, and fourth conductive lines connected to the plurality of second electrodes.

According to an embodiment, the display may further include first junction pads that connect the plurality of first electrodes to the third conductive lines, and second junction pads that connect the plurality of second electrodes to the fourth conductive lines.

According to an embodiment, an electronic device may include a housing including a first surface, and a second surface facing in a direction opposite to the first surface, a circuit board disposed inside the housing, and a display disposed at least partially between the first surface and the circuit board. The display may include a window, a touch screen panel disposed under the window, a display panel disposed under the touch screen panel and including a first flexible substrate, a driving circuit configured to drive the touch screen panel or the display panel, and a second flexible substrate extending from a partial portion of the touch screen panel to the outside of the touch screen panel. The second flexible substrate may include a driving circuit area in which the driving circuit is disposed, at least one first wire connected to the driving circuit and the touch screen panel, and a bending area bent with respect to the touch screen panel.

According to an embodiment, the bending area of the second flexible substrate may be bent to surround the first flexible substrate.

According to an embodiment, the bending area may include a protection member configured to protect the at least one first wire.

According to an embodiment, the second flexible substrate may include a COP.

According to an embodiment, the window may include a transparent area and a bezel area surrounding at least a part of the transparent area and the bending area may be disposed under the bezel area.

According to an embodiment, the second flexible substrate may be bent, thereby being separate from the window.

According to an embodiment, at least one second wire may be disposed on the first flexible substrate.

According to an embodiment, the electronic device may further include a protection member disposed between the first flexible substrate and the second flexible substrate.

According to various embodiments, a method for fabricating a display may include preparing a window, attaching at least a part of a touch screen panel to the window, attaching at least a part of a display panel to at least a part of the touch screen panel, and bending a second flexible substrate of the touch screen panel.

According to various embodiments, a display may include a window, a touch screen panel disposed under the window, a display panel disposed under the touch screen panel and including a first flexible substrate, a driving circuit configured to drive the touch screen panel or the display panel, and a second flexible substrate extending from a partial portion of the touch screen panel to the outside of the touch screen panel, and including at least one wire connected to the driving circuit and the touch screen panel. The second flexible substrate may be bent together with the at least one first wire, thereby surrounding the first flexible substrate.

While the disclosure has been shown and described with reference to certain exemplary embodiments thereof, it will be understood by those skilled in the art that various changes in form and details may be made therein without departing from the spirit and scope of the disclosure as defined by the appended claims and their equivalents.

The invention claimed is:

1. A display comprising:
   a touch screen panel;
   a window disposed on the touch screen panel, the window including a transparent area and a bezel area surrounding at least a part of the transparent area;
   a display panel disposed under the touch screen panel, and including a first flexible substrate;
   a driving circuit configured to drive the touch screen panel or the display panel; and
   a second flexible substrate extending from a partial portion of the touch screen panel to the outside of the touch screen panel,
   wherein the second flexible substrate comprises:
      a driving circuit area in which the driving circuit is disposed;
      at least one first wire connected to the driving circuit and the touch screen panel; and a bending area bent with respect to the touch screen panel, and wherein the driving circuit area is disposed under the display panel within the transparent area.

2. The display of claim 1, wherein the bending area of the second flexible substrate is bent to surround the first flexible substrate.

3. The display of claim 1, wherein the bending area includes a protection member configured to protect the at least one first wire.

4. The display of claim 1, wherein the second flexible substrate includes a chip on plastic (COP).

5. The display of claim 1
wherein the bending area is disposed under the bezel area,
wherein the second flexible substrate is bent, thereby being apart from the window.

6. The display of claim 1, wherein at least one second wire is disposed on the first flexible substrate.

7. The display of claim 1, wherein a plurality of electrodes are arranged on the touch screen panel, and
wherein the plurality of electrodes comprise:
a plurality of first electrode patterns arranged along a first axis; and
a plurality of second electrode patterns arranged along a second axis substantially perpendicular to the first axis wherein the at least one first wire comprises:
third conductive lines connected to the plurality of first electrodes; and
fourth conductive lines connected to the plurality of second electrodes.

8. The display of claim 7, further comprising:
first junction pads connecting the plurality of first electrodes to the third conductive lines; and
second junction pads connecting the plurality of second electrodes to the fourth conductive lines.

9. An electronic device comprising:
a housing including a first surface, and a second surface facing in a direction opposite to the first surface;
a circuit board disposed inside the housing; and
a display disposed at least partially between the first surface and the circuit board,
wherein the display comprises:
a window including a transparent area and a bezel area surrounding at least a part of the transparent area;
a touch screen panel disposed under the window;
a display panel disposed under the touch screen panel, and including a first flexible substrate;
a driving circuit configured to drive the touch screen panel or the display panel; and
a second flexible substrate extending from a partial portion of the touch screen panel to the outside of the touch screen panel, and
wherein the second flexible substrate comprises:
a driving circuit area in which the driving circuit is disposed;
at least one first wire connected to the driving circuit and the touch screen panel; and
a bending area bent with respect to the touch screen panel, and
wherein the driving circuit area is disposed under the display panel within the transparent area.

10. The electronic device of claim 9, wherein the bending area of the second flexible substrate is bent to surround the first flexible substrate.

11. The electronic device of claim 9, wherein the bending area includes a protection member configured to protect the at least one first wire.

12. The electronic device of claim 9, wherein the second flexible substrate includes a chip on plastic (COP).

13. The electronic device of claim 9, wherein
the bending area is disposed under the bezel area, wherein the second flexible substrate is bent, thereby being apart from the window.

14. The electronic device of claim 9, wherein at least one second wire is disposed on the first flexible substrate.

15. The electronic device of claim 9, further comprising a protection member disposed between the first flexible substrate and the second flexible substrate.

* * * * *